United States Patent [19]
Keating

[11] Patent Number: 5,886,577
[45] Date of Patent: Mar. 23, 1999

[54] APPARATUS FOR EFFICIENT CURRENT AMPLIFICATION

[75] Inventor: Pierce V. Keating, Pompano Beach, Fla.

[73] Assignee: Motorola, Inc., Schaumburg, Ill.

[21] Appl. No.: 900,146

[22] Filed: Jul. 28, 1997

[51] Int. Cl.[6] .............................. H03F 3/45; H03F 3/68
[52] U.S. Cl. ........................................... 330/252; 330/295
[58] Field of Search ................................. 330/252, 292, 330/295; 327/359

[56] References Cited

U.S. PATENT DOCUMENTS 5,440,271  8/1995  Laws .......................................... 330/252

Primary Examiner—Robert Pascal
Assistant Examiner—Patricia Thuy Nguyen
Attorney, Agent, or Firm—Barbara R. Doutre

[57] ABSTRACT

Two emitter follower transistors (260, 250), in which each transistor has an emitter coupled to one of the collectors of a differential pair structure (230, 240)to form two stacked transistor pairs (260, 230) and (250, 240). A first differential signal (IN, INX) is positive supply referenced (Vcc) and is coupled to the bases of the emitter follower transistors (250, 260). A second differential input signal (275, 295) is coupled to the bases of the differential pair transistors (230, 240). The second differential input signal (275, 295) is identical to the first input signal but also includes a voltage level shift from the positive supply (Vcc). The first and second input signal portions are coupled to the transistors which make up the stacked transistor pair (260, 230) and (250, 240) and are chosen so that they are 180 degrees out of phase.

5 Claims, 5 Drawing Sheets

APPARATUS FOR EFFICIENT CURRENT AMPLIFICATION

TECHNICAL FIELD

This invention relates, in general, to amplifier devices, and more specifically, to efficient current amplification in radio frequency applications.

BACKGROUND

High current drivers often consume a substantial portion of the total current required for integrated circuits. Emitter follower configurations are attractive as high current drivers because of their high input impedance, low output impedance, and high current sourcing capabilities. However, traditional differential NPN emitter follower circuits generally provide poor or inefficient mechanisms for current sinking and also no voltage gain.

FIG. 1 illustrates a prior art differential current amplifier using first and second transistors 170, 180, respectively, configured as emitter followers. The IN signal 110 forms one-half of a differential signal and is coupled to the base of the second transistor 180. The INX signal 120 forms the other half of the differential signal and is coupled to the base of the first transistor 170. For the purposes of this discussion, a differential signal is composed of two signals which are 180 degrees out of phase. The output signals OUT 130 and OUTX 140 are current amplified versions of the signals IN 110 and INX 120. Since the first transistor 170 and the second transistor 180 can only source current and have no means to sink current, a first current source 150 has been coupled to the emitter of the first transistor 170 and a second current source 160 has been coupled to the emitter of the second transistor 180. The amount of current which the first and second current sources 150, 160 are capable of sinking must be large enough to discharge any capacitance, presented at the output signals OUT 130 and OUTX 140, in a time period sufficient to meet the bandwidth requirements of the application. Since the first and second current sources 150, 160 constantly sink current regardless of the signal amplitude, they result in a waste of current. Further, when the first and second transistors 170, 180 source current in an attempt to charge any load capacitances, some of the current sourced is diverted to the first and second current sources 150, 160.

A push-pull amplifier is an alternative high current output configuration. However, push-pull amplifiers require the use of high quality PNP devices which are often not available in integrated circuits, and therefore, useable push-pull amplifier structures are often not realizable, especially where the amplifier is to be used at radio frequencies.

Accordingly, there is a need for a differential current amplifier circuit which does not require both PNP and NPN transistors, and which is more efficient than conventional emitter follower circuits.

BRIEF DESCRIPTION OF THE DRAWINGS

The features of the present invention, which are believed to be novel, are set forth with particularity in the appended claims. The invention, together with further objects and advantages thereof, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
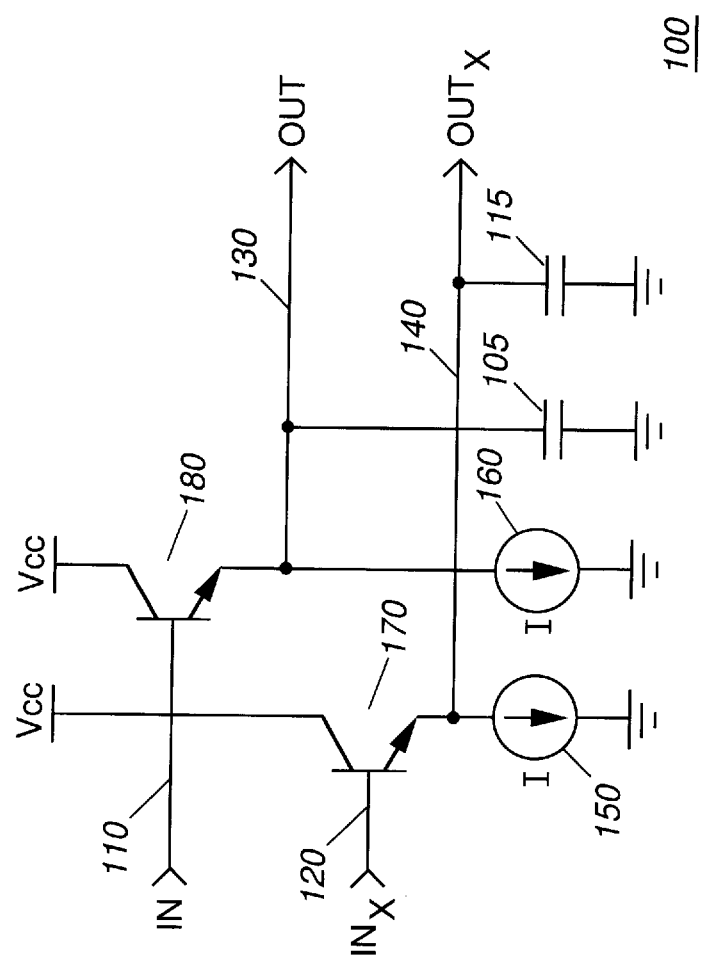
FIG. 1 is a prior art differential emitter follower circuit.

While the specification concludes with claims defining the features of the invention that are regarded as novel, it is believed that the invention will be better understood from a consideration of the following description in conjunction with the drawing figures, in which like reference numerals are carried forward.

An amplifier is disclosed herein which uses only NPN type transistors as a differential emitter follower circuit, which also provides desirable properties similar to those of a push-pull type circuit.

Figure 2:
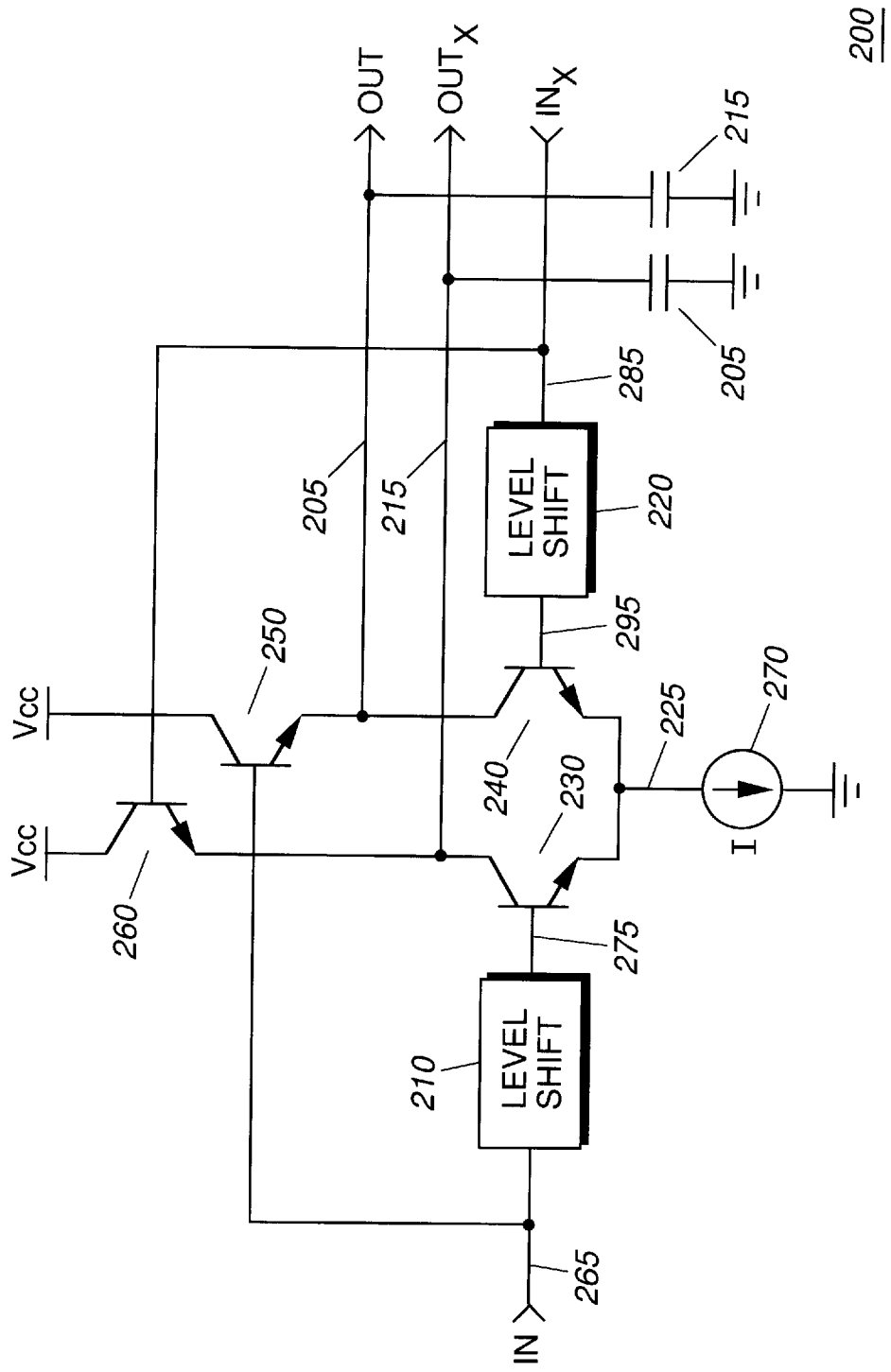
FIG. 2 is a first embodiment of a single stage current amplifier in accordance with the present invention.

FIG. 2 is a current amplifier 200 in accordance with a first embodiment of the present invention. Two emitter follower transistors (260, 250) each have an emitter coupled to one of the collectors of a differential pair structure (230, 240) to form first and second stacked transistor pairs (260, 230) and (250, 240) respectively. A first differential signal (IN, INX) is positive supply referenced (Vcc) and is coupled to the bases of the emitter follower transistors (250, 260). A second differential input signal (275, 295) is coupled to the bases of the differential pair transistors (230, 240). The second differential input signal (275, 295) is similar to the first differential input signal except that the second differential input signal includes a voltage level shift from the positive supply (Vcc).

In accordance with the present invention, each of the first and second differential input signals includes first and second half portions in which one half portion of the first differential input signal INX 285 and one half portion of the second differential input signal 275 are coupled as inputs to the bases of the first stacked transistor pair (230, 260) with each half portion being substantially 180 degrees out of phase with each other. The other half portion of the first differential input signal IN 265 and the other half portion of the second differential input signal 295 are coupled as inputs to the bases of the second stacked transistor pair (240, 250) with each half portion being 180 degrees out of phase with each other.

Amplifier 200 includes a single current source 270. The amount of current provided by the current source 270 is generally less than that of the first and second current sources 150, 160 of the prior art. The differential pair is formed by first transistor 230 and second transistor 240 which are emitter coupled to the current source 270. Input ports receive a differential input signal composed of IN 265 and INX 285 provided to the first and second level shift circuits, 210 and 220, respectively. The first and second level shift circuits 210, 220 provide at their corresponding output ports for level shifted signals 275, 295, a volt drop of at least one-half of a diode drop or approximately 400 mV. Signals IN 265 and INX 285 are referenced to the positive voltage supply Vcc. The first and second level shifted input signals 275 and 295, respectively, resemble the corresponding signals, IN 265 and INX 285 except that the first and second level shifted input signals 275 and 295 are referenced to the positive voltage supply minus at least 400 millivolts (mV).

The third transistor 260 and the fourth transistor 250 each have their emitter coupled to the collector of the first transistor 230 and the second transistor 240, respectively. A noninverting output OUT 205 is formed at the emitter of the fourth transistor 250 and an inverting output OUTX 215 is formed at the emitter of the third transistor 260. In this configuration, when IN 265 becomes higher in voltage than INX 285, the first transistor 230 will conduct essentially all of the current sourced by the current source 270, while the second transistor 240 will be essentially nonconducting. At the same time, the fourth transistor 250 will begin to source current as the signal IN 265 becomes higher in voltage. Since the second transistor 240 is nonconducting, all of the current sourced by the fourth transistor 250 will charge the first capacitive load 215. The third transistor 260 will begin to shut off as INX 285 becomes lower in voltage, while the first transistor 230 will source current to discharge the second capacitive load 205. Further, a voltage gain is obtained in the OUT 205 and OUTX 215 signals because of modulation in the base-emitter voltages in the third and fourth transistors 260, 250 caused by the switching of current in the first and second transistors 230, 240.

Figure 3:
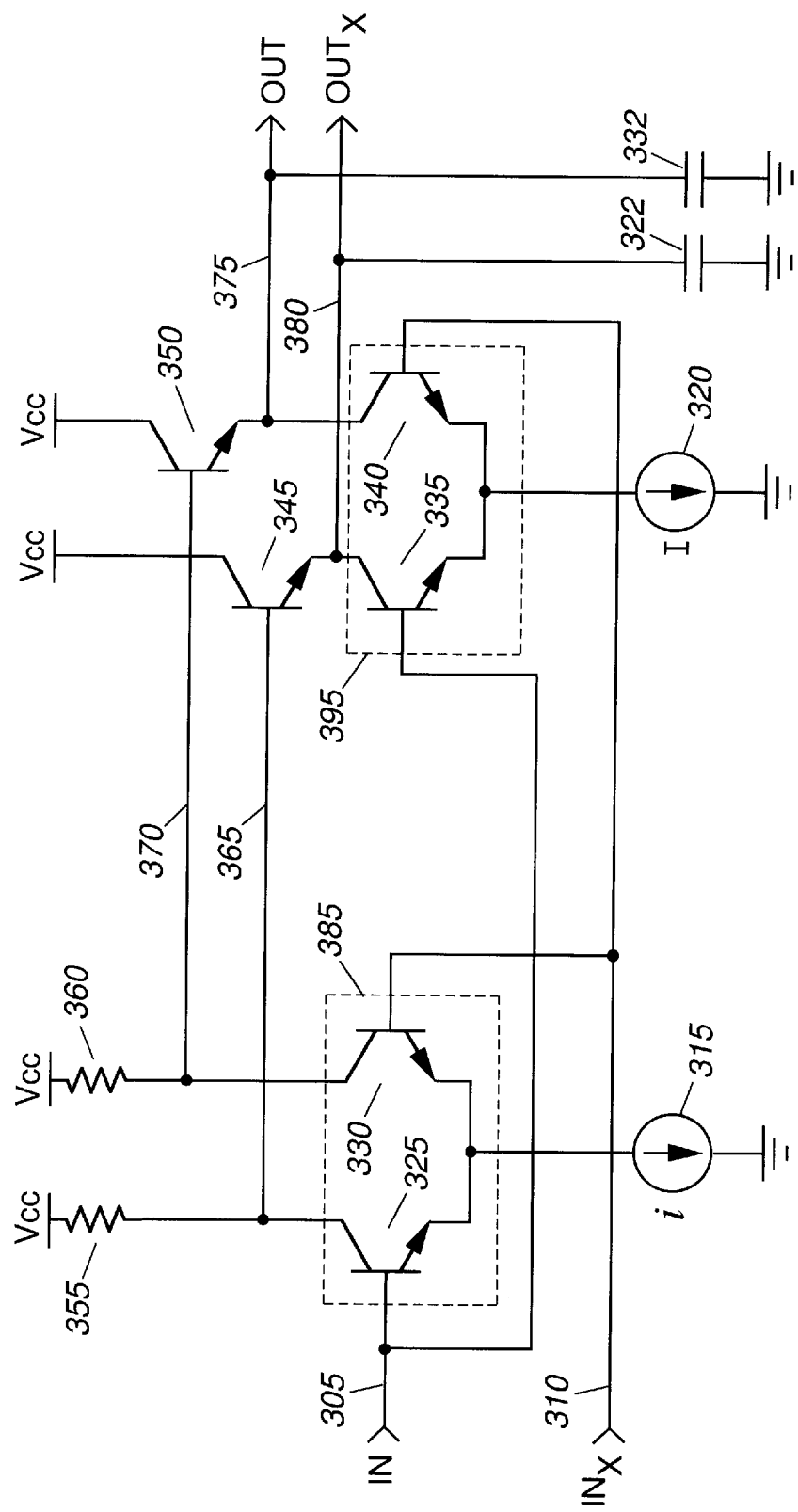
FIG. 3 is a second embodiment a single stage current amplifier in accordance with the present invention.

FIG. 3 is a current amplifier 300 in accordance with a second embodiment of the present invention. In FIG. 3, a differential signal composed of IN 305 and INX 310 is voltage level shifted from the positive voltage supply by at least a half diode voltage drop. A first differential pair 385 is comprised of first transistor 325 and second transistor 330. A second differential pair 395 is comprised of third transistor 335 and fourth transistor 340. The first differential pair 385 provides a supply referenced signal at the collectors of the first and second transistors 325, 330 which is used to drive the bases of fifth and sixth transistors 345 and 350 respectively.

The circuit in FIG. 3 operates similarly to the circuit shown in FIG. 2, in that when the second differential pair 395 is driven by the signals IN 305 and INX 310 such that all of the current provided by a second current source 320 is conducted by the fourth transistor 340, the signal presented to the base of the sixth transistor 350 will become lower in voltage, and will begin to shut off the sixth transistor 350. At the same time, the third transistor 335 will be essentially nonconducting, while the signal presented to the base of the fifth transistor 345 will become larger in voltage, and the fifth transistor 345 will consequently begin to source current and charge the first capacitive load 322. Once again, all of the current sourced by the fifth transistor 345 will be used to charge the first capacitive load 322, since the third transistor 335 will be shut off.

Typically, the current provided by the first current source 315 is much less than the current provided by second current source 320, since the first differential pair 385 drives only the load resistors 355 and 360, and the high impedance seen at the bases of fifth and sixth transistors 345 and 350. A typical current ratio between the second current source 320 and the first current source 315 is 7 to 1.

Figure 4:
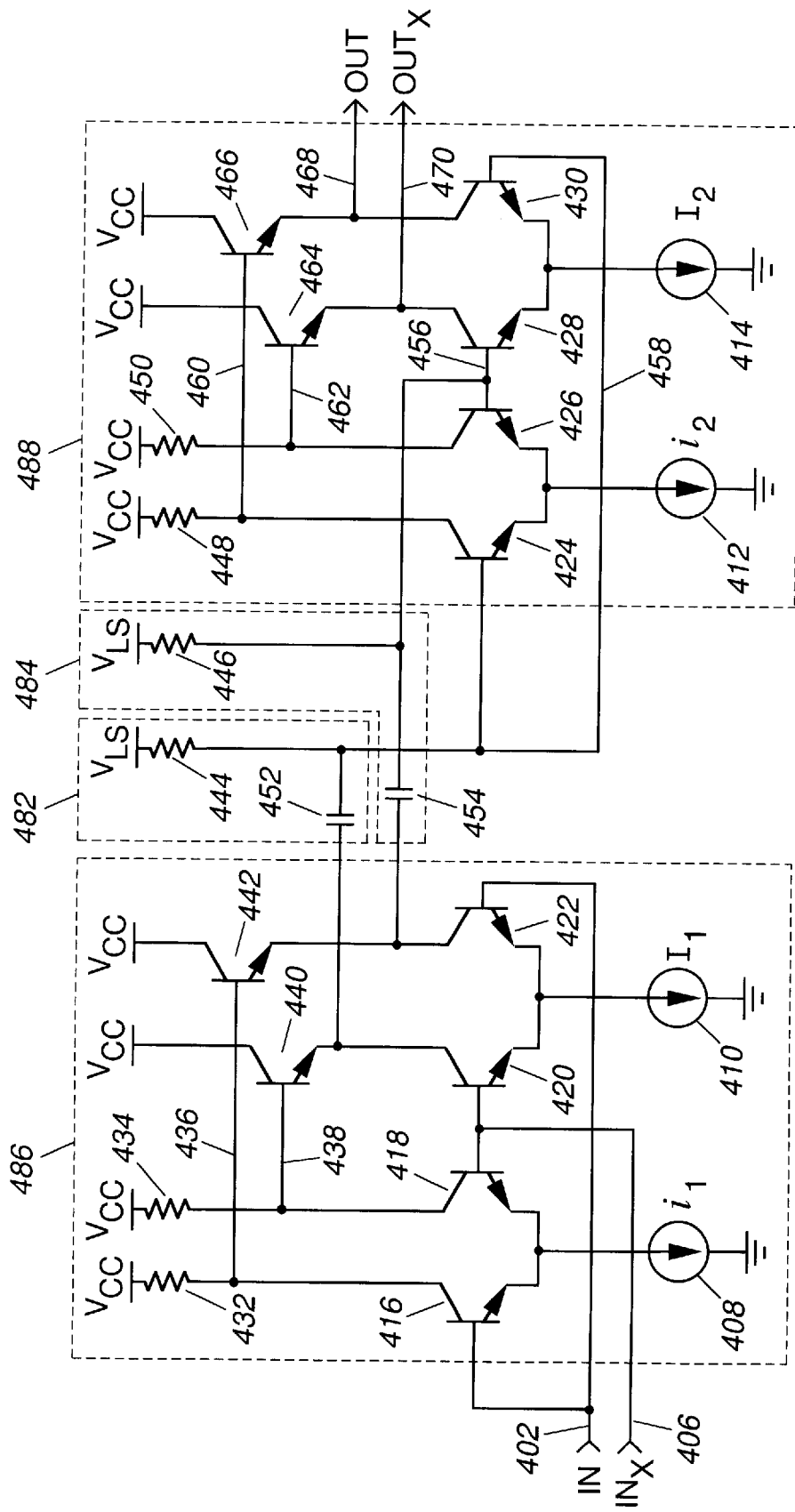
FIG. 4 shows the circuit of FIG. 3 cascaded to form a multistage current amplifier in accordance with the present invention.

FIG. 4 illustrates how the circuit presented in FIG. 3 may be cascaded to form a multistage current amplifier in accordance with the present invention. Voltage level shift circuit 482, and voltage level shift circuit 484 are included between the first current amplifier 486, and the second current amplifier 488. The two voltage level shift circuits 482, 484 are only necessary to the circuit for low voltage supply applications. The voltage level shifts provided by the voltage level shift circuits 482, 484 are set by the voltage supply $V_{LS}$. The voltage supply $V_{LS}$ must be no less than one half a diode voltage drop from the positive voltage supply Vcc to avoid saturation of the transistors 420, 422, 428, and 430.

Figure 5:
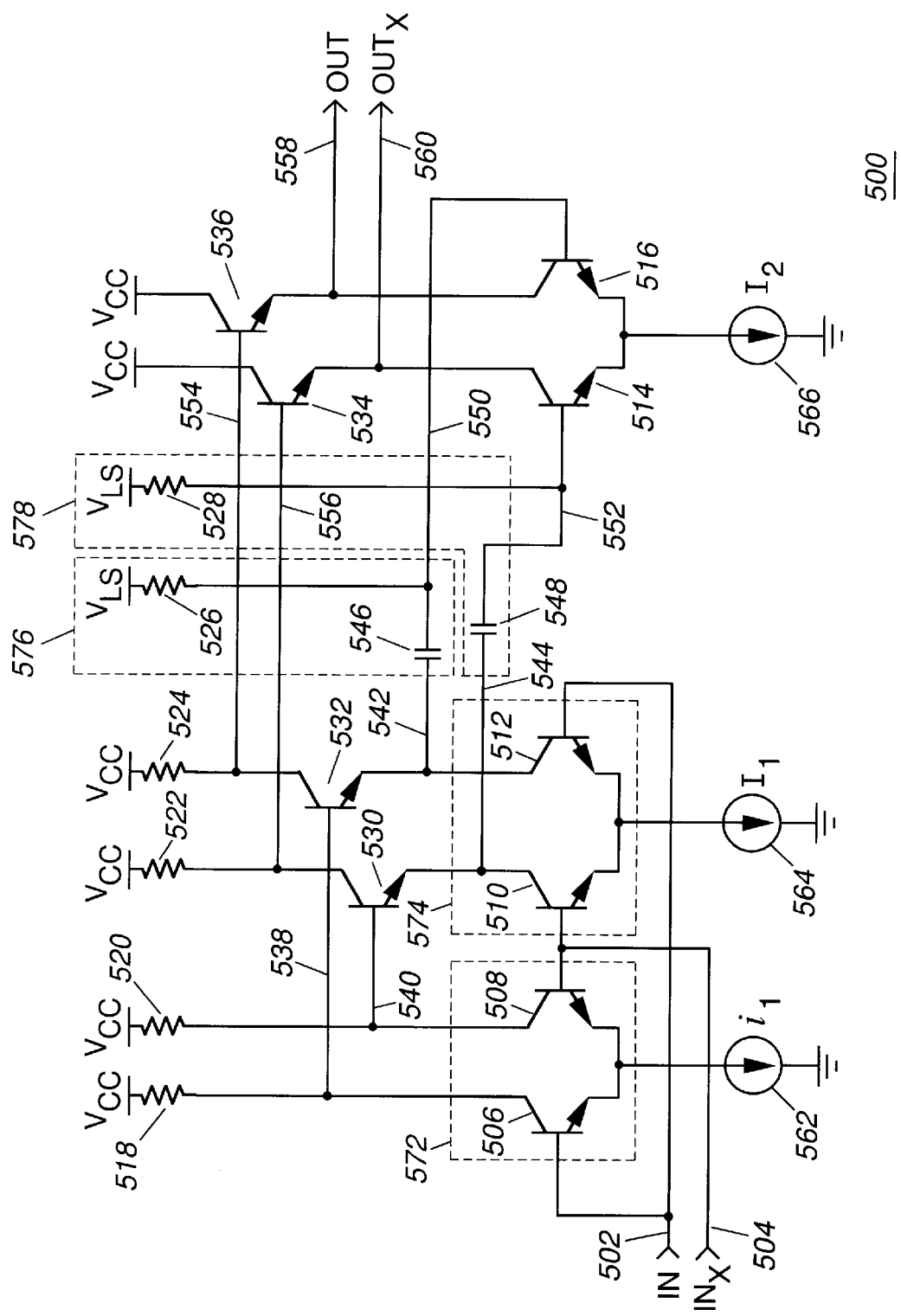
FIG. 5 is another embodiment of a multistage current amplifier in accordance with the present invention.

FIG. 5 depicts yet another embodiment of a multistage current amplifier in accordance with the present invention. A first differential pair 572 and a second differential pair 574 are configured similarly to the current amplifier 300 shown in FIG. 3, with the addition of a third resistor 522 coupled between the positive voltage supply Vcc and the collector of the fifth transistor 530, and the addition of a fourth resistor 524 coupled between the positive voltage supply Vcc and the collector of the sixth transistor 532. The third and fourth resistors 522, 524 eliminate an additional differential transistor pair by providing a supply referenced signals 554, and 556 which may be directly coupled to the bases of transistors 536, and 534 respectively. Two voltage level shift circuits 576, and 578 have again been provided for low voltage supply operation. For example, the voltage level shift circuits 576 and 578 typically would not be necessary for applications using a voltage supply over 3.3 V.

The amplifier circuits described by the invention provide for efficient current amplification for differential signals. When compared to a conventional differential emitter follower configuration having constant current sources, the present amplifier circuits described by the invention provide for an improvement in efficiency which approaches 50%.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:
1. A current amplifier, comprising:
    input ports for receiving a differential input signal having a positive signal and a negative signal, the differential input signal having a voltage level shift;
    a first differential pair comprising first and second transistors, each having a base, collector and emitter, the positive signal being coupled to the base of the first transistor, the negative signal being coupled to the base of the second transistor, the collector of the first transistor being coupled to a supply voltage through a first resistor path, the collector of the second transistor being coupled to the supply voltage through a second resistor path, the emitters of the first and second transistors being coupled to a ground reference through a first current source;
    a second differential pair comprising third and fourth transistors, each having a base, collector and emitter, the positive signal being coupled to the base of the third transistor, the negative signal being coupled to the base of the fourth transistor, the emitters of the third and fourth transistors being coupled to the ground reference through a second current source; and
    fifth and sixth transistors each having a base, collector and emitter, the base of the fifth transistor being coupled to the collector of the first transistor, the base of the sixth transistor being coupled to the collector of the second transistor, the emitter of the fifth transistor being coupled to the collector of the third transistor, the emitter of the sixth transistor being coupled to the collector of the fourth transistor, the collectors of the fifth and sixth transistors being coupled to the supply voltage, a first amplified differential output signal being generated at the emitters of the fifth and sixth transistors.
2. An apparatus as in claim 1, further comprising:
    a third differential pair having seventh and eighth transistors, each having a base, collector and emitter, the first amplified differential output signal composed of a positive output signal and a negative output signal, the positive output signal coupled to the base of the seventh transistor and the negative output signal coupled to the base of the eighth transistor, the emitters of the seventh and eighth transistors being coupled to the ground reference through a third current source, the collector of the seventh transistor being coupled to the supply voltage through a third resistive path, the collector of the eighth transistor being coupled to the supply voltage through a fourth resistive path; and ninth and tenth transistors each having a base, collector and emitter, the base of the ninth transistor being coupled to the collector of the fifth transistor, the base of the tenth transistor being coupled to the collector of the sixth transistor, the emitter of the ninth transistor being coupled to the collector of the seventh transistor, the emitter of the tenth transistor being coupled to the collector of the eighth transistor, a second amplified differential output signal generated at the emitters of the ninth and tenth transistors, the collectors of the ninth and tenth transistors being coupled to the supply.

3. An apparatus as described in claim 2, wherein the positive output signal is coupled to the base of the seventh transistor through a first voltage level shift circuit, and wherein the negative output signal is coupled to the base of the eighth transistor through a second voltage level shift circuit.

4. An apparatus as described in claim 3, wherein the first voltage level shift circuit comprises:

a first coupling capacitor coupled between the emitter of the fifth transistor and the base of the seventh transistor, the base of the seventh transistor having a pull-up resistor to a second supply voltage; and a second coupling capacitor coupled between the emitter of the sixth transistor and the base of the eighth transistor, the base of the eighth transistor having a pull-up resistor to the second supply voltage.

5. An apparatus as described in claim 1, further comprising:

first and second coupling capacitors, the first coupling capacitor being coupled between the emitter of the sixth transistor and a second supply through a third resistive path, the second coupling capacitor being coupled between the emitter of the fifth transistor and a second supply through a fourth resistive path, a level shifted differential output signal being generated at the first and second coupling capacitors.

* * * * *